(12) United States Patent
Coccioli

(10) Patent No.: US 6,700,181 B1
(45) Date of Patent: Mar. 2, 2004

(54) METHOD AND SYSTEM FOR BROADBAND TRANSITION FROM IC PACKAGE TO MOTHERBOARD

(75) Inventor: Roberto Coccioli, Simi Valley, CA (US)

(73) Assignee: Inphi Corporation, Westlake Village, CA (US)

( * ) Notice: Subject to any disclaimer, the term of this patent is extended or adjusted under 35 U.S.C. 154(b) by 0 days.

(21) Appl. No.: 10/300,810

(22) Filed: Nov. 19, 2002

(51) Int. Cl.[7] ............................................. H01L 23/552
(52) U.S. Cl. ...................................... 257/659; 257/698
(58) Field of Search ................................. 257/659, 698

(56) References Cited

U.S. PATENT DOCUMENTS

2002/0179332 A1 * 12/2002 Uematsu et al. ............ 174/262
2003/0102536 A1 * 6/2003 Barre et al. .................. 257/662

* cited by examiner

Primary Examiner—Hoai Ho
Assistant Examiner—Tu-Tu Ho
(74) Attorney, Agent, or Firm—Fernandez & Associates LLP

(57) ABSTRACT

A method and system for broadband transition between an integrated circuit (IC) package and a printed wiring board (PWB). A vertical quasi-coaxial cable structure is created connecting the transmission line inside the package to the transmission line on the PWB. The solder ball is eliminated and replaced with ad hoc layout on the bottom of the package, with mating layout on the top layer of the PWB. Complete transition from package to PWB is considered, giving particular attention not only to the impedance of the lines and the transition but also to the continuity of the current flow along the signal path.

32 Claims, 8 Drawing Sheets

REGION 210

METHOD AND SYSTEM FOR BROADBAND TRANSITION FROM IC PACKAGE TO MOTHERBOARD

FIELD OF THE INVENTION

The invention relates to IC packaging, particularly to IC packaging for high frequency applications.

BACKGROUND

Packaging for high-speed digital circuits running at 40 Gbps and beyond is still an open problem. The main problem in package design is the elimination of discontinuities along the high-frequency signal and ground paths from the integrated circuit, through the package, to the printed circuit board.

Specifically, what remains an open problem is the realization of a small form factor package with broadband characteristic (DC to 50 GHz and beyond) for high-speed digital integrated circuit with multiple I/Os. Having multiple I/Os requires the use of a packaging technology that allows using multiple metal layers for signal routing. On the other hand, the presence of multiple metal layers renders more difficult the design of broadband transitions due to discontinuities (bends, vias, transition from micro strip to stripline configuration, etc.) in the high-speed signal path. Also, the higher number of I/Os generally implies bigger footprint for the package and higher power dissipation. Those two requirements pose additional challenges to thermal management and second level joints reliability.

A few papers analyzing the electrical performance of transitions inside a multilayer ceramic structure are available in the literature [1,2]. Other researchers are addressing the problem of transition from the package to the board [3] using ball grid array (BGA) technology. One of the issues of BGA technology is the excitation of parallel plate mode between the package ground and the motherboard ground launched by the package solder balls. This limitation could be finally overcome by using smaller and smaller solder ball on a decreasing pitch, but this creates manufacturing problems.

References

[1] Interconnects and transitions in multilayer LTCC multichip modules for 24 GHz ISM-band applications
  Simon, W.; Kulke, R.; Wien, A.; Rittweger, M.; Wolff I.; Girard, A.; Bertinet, J-P. Microwave Symposium Digest. 2000 IEEE MTT-S International, Volume: 2, Page(s): 1047–1050.
[2] RF/Microwave Characterization of Multilayer Ceramic-Based MCM Technology
  Sutono A., Pham, A-V. H, Laskar, J., Smith, W. R. IEEE Transactions on Advanced Packaging, Vol. 2, August 1999, pp. 326–331.
[3] 50 GHz broadband SMT package for microwave applications
  Yoshida, K.; Shirasaki, T.; Matsuzono, S.; Makihara, C. Electronic Components and Technology Conference, 2001. Proceedings. Page(s): 744–749

BRIEF DESCRIPTION OF THE FIGURES

The accompanying drawings which are incorporated in and form a part of this specification, illustrate embodiments of the invention and together with the description, serve to explain the principles of the invention.

DETAILED DESCRIPTION

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
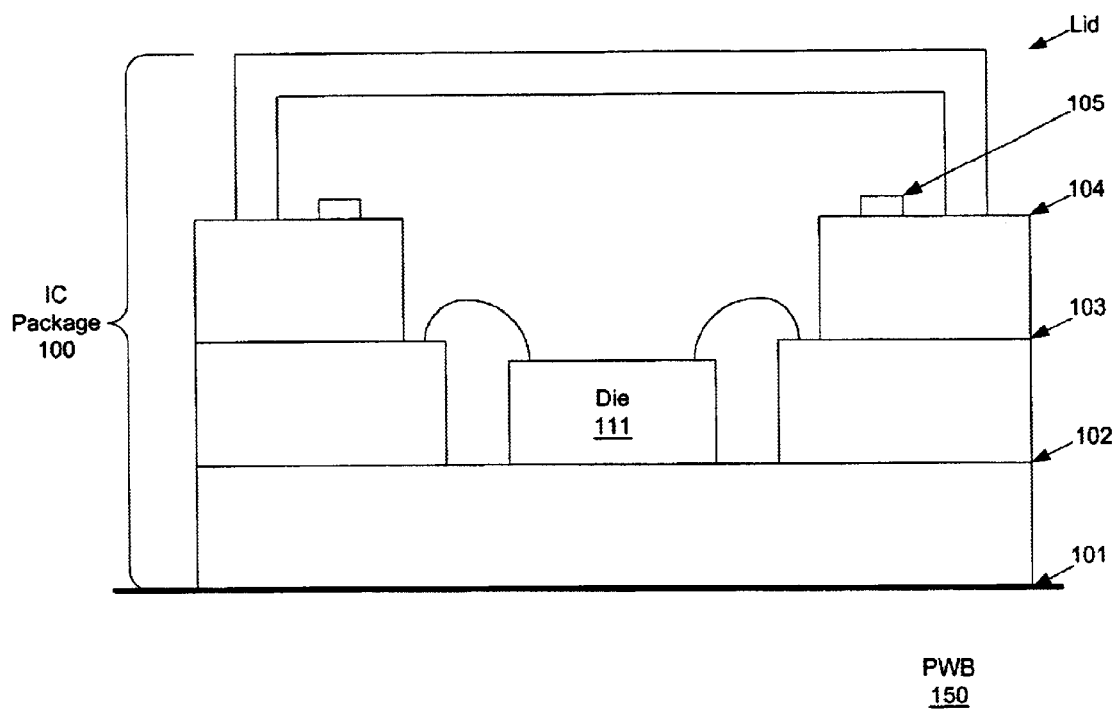
FIG. 1 depicts a side view of an integrated circuit (IC) package in accordance with one embodiment of the invention.

Referring now to FIG. 1, a side view of an integrated circuit (IC) package 100 is depicted in accordance with one embodiment of the invention. IC package 100 is shown with a die 111 in place. Also as shown, IC package 100 is adapted to be mounted onto a printed wiring board (PWB) 150. The broadband transition from IC package 100 to PWB 150 can be used in surface mount packages for high-speed (i.e., broadband) digital equipment requiring bandwidth from DC to 50 GHz and beyond.

The stack-up of IC package 100 comprises ground and power planes, signal layers, coupled transmission lines for high-speed differential signaling, coupled vertical transitions to PWB 150, shielding vias, castellation at package edge, and ground ring layout. Package 100 provides low return loss electrical performance from DC to 50 GHz and beyond. PWB 150 includes coupled vertical transitions to package 100 and coupled transmission lines for high-speed differential signaling.

Specifically, coupled vertical transitions are implemented through IC package 100 and the PWB 150. Shielding vias inside IC package 100 realizing a vertical metal wall which isolates each pair of high-speed differential signaling lines, prevent energy leakage and package resonance as well as provide shortest possible path for ground return current.

Ground ring layout formed by shielding vias and a pair of coupled signal vias from layer 103 to layer 101 of IC package 100 realizes a continuous quasi-coaxial vertical cable structure from the signal layer 103 of IC package 100 to the signal layer on PWB 150. Specifically, ground ring layout on layer 101 at the bottom of IC package 100 realizes a continuous quasi-coaxial vertical structure from the signal layer 103 of IC package 100 to the signal layer on the PWVB 150. The wall formed by shielding vias can be thought of as analogous to the shielding outer metal of a coaxial cable, whereas the coupled signal vias can be thought of as analogous to the core conducting member of the coaxial cable. As such, a vertical quasi-coaxial cable structure is created connecting the transmission line inside IC package 100 to the transmission line on PWB 150. The solder ball is eliminated and replaced with ad hoc layout on the bottom layer 101 of IC package 100, with mating layout on the top layer of PWB 150. Thus, complete transition from IC package 100 to PWB 150 is realized, giving particular attention not only to the impedance of the lines and the transition but also to the continuity of the current flow along the signal path.

Castellation at the package edge enhances isolation between adjacent differential signaling wire line pairs and suppresses radiation from the transition at high frequency. However, as understood herein, using castellation this way need not be limited to a package that implements differential signaling. That is, castellation can also be used to isolate and suppress radiation resulting from the transition at high frequency for a conventional package that implements single-ended signaling.

As understood herein, the characteristic impedance of coupled lines used need not be limited to 50 Ohm, as long as the transmission lines have characteristic impedance matched to the output impedance of die 111.

Cross-sectional views 101–105 of IC package 100 will be described to depict the inner layout of IC package 100. As such, the interplay between these different elements in IC package 100 and PWB 150 are discussed using cross sectional views 101–105 of IC package 100 shown respectively by FIGS. 2A–E in view of FIG. 1. That is, FIGS. 2A–E depict respectively cross sectional views 101–105 of IC package 100 in accordance with the embodiment of the invention introduced in FIG. 1.

Figure 2A:
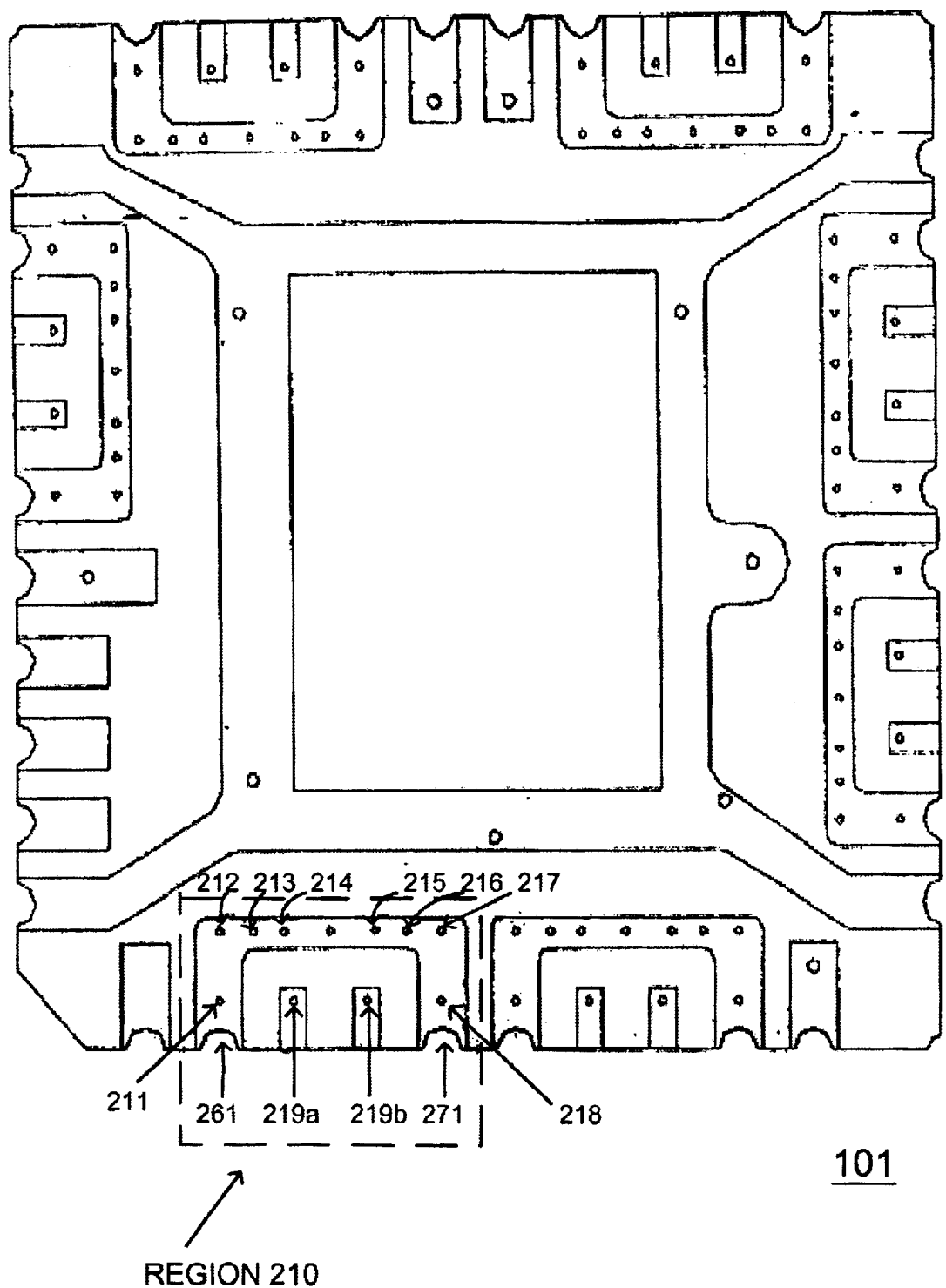
FIG. 2A depicts a cross-section of the IC package in accordance with the embodiment introduced in FIG. 1.

Referring specifically now to FIG. 2A, top view of cross section 101 of IC package 100 is shown in accordance with the embodiment introduced in FIG. 1. Cross sectional 101 depicts the bottom of IC package 100 that will be mounted onto PWB 150.

In region 210, although shielding vias are not explicitly shown here, they are numbered 201–209 to facilitate description. Shielding vias 201–209 are understood to respectively go through openings 211–219. In other words, openings 211–219 as shown are created for accommodating shielding vias 201–209 (not shown). Also, openings 219a and 219b as shown are created for accommodating a pair of coupled vias 289a and 289b (numbered but not shown) carrying the high-speed differential signal.

IC package 100 implements differential signaling rather than single-ended signaling that is used for a conventional IC packag. Thus, high-speed lines in IC package 100 and vias 289a and 289b are adapted for differential signaling rather than single-ended signaling. In the present embodiment, odd mode impedance of high-speed lines and vias is matched to input and output odd mode impedance of die 111.

Together, shielding vias 201–209 can be thought of as forming a "vertical" metal wall that isolates the pair of wire lines 289a and 289b for high-speed differential signaling. "Vertical" herein indicates the orientation of shielding vias 201–209 with respect to IC package 100. The technique of forming a vertical metal wall using a formation of shielding vias is applied to other pairs of wire lines for differential signaling (shown but not numbered) in IC package 100 as well. Moreover, shielding vias 201–209 also prevent energy leakage and package resonance as well as provide shortest possible path for ground return current.

In region 210, castellations 261 and 271 at the package edge enhance isolation between a pair of differential signaling wires 289a and 289b and their adjacent pairs of differential signaling wires, and suppress radiation from the transition at high frequency. As such, castellations 261 and 271 are adapted to shield radiation emitted by differential lines 289a and 289b. Castellations 261 and 271 are coated with metal or another electrically conducting material and realize an electrical connection between the ground plane on layers 104, 103, and 102, and the ground ring layout in region 210 on layer 101. Those electrical connections can also be realized with solid vias cut in half during the package singulation process.

Region 210 can be thought of as a ground ring layout in cross section 101. This ground ring layout can be thought of as a portion of a continuous quasi-coaxial vertical cable structure from the top signal layer of IC package 100 to the signal layer on PWB 150.

Figure 2B:
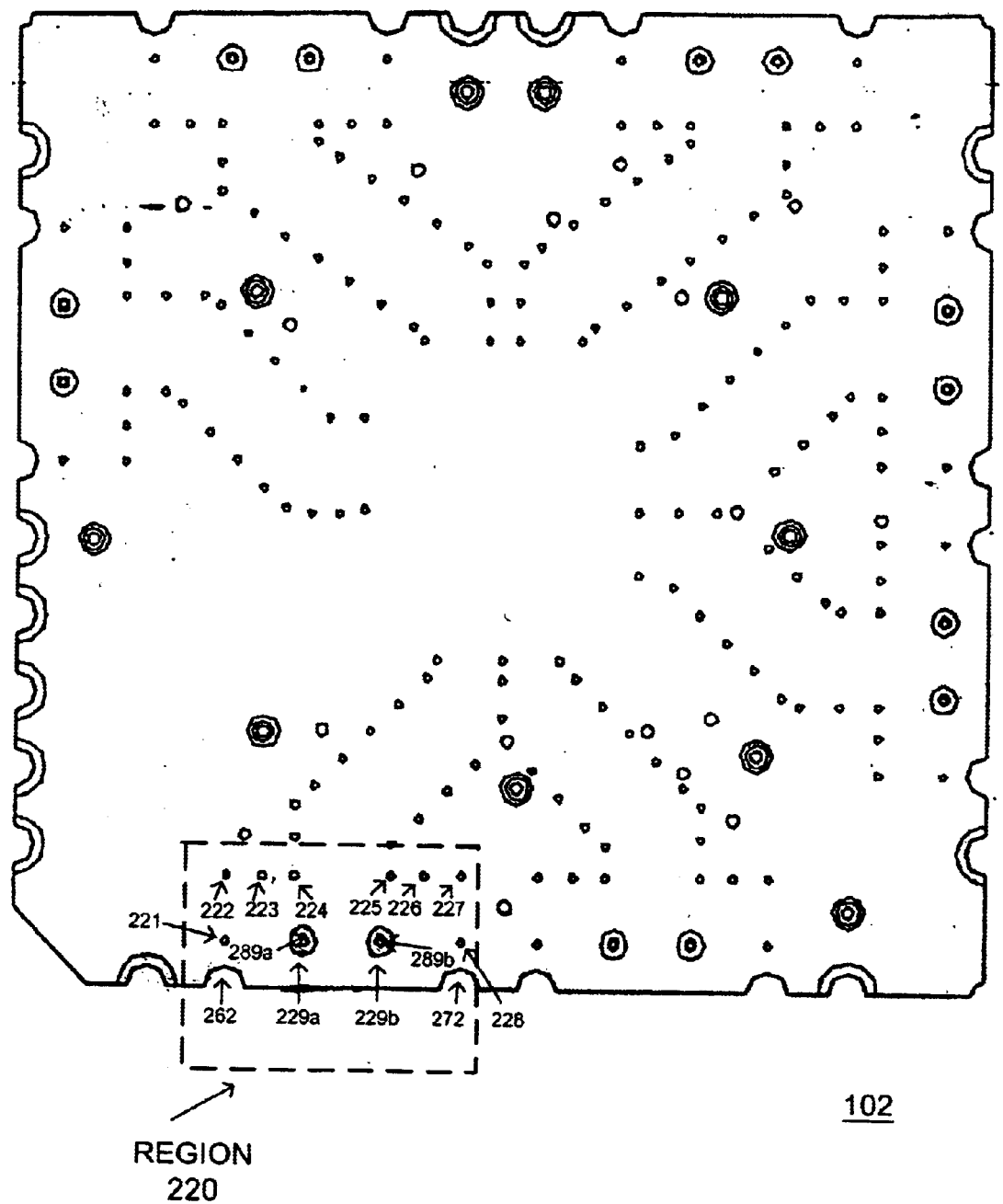
FIG. 2B depicts a cross-section of the IC package in accordance with the embodiment introduced in FIG. 1.

Referring now to FIG. 2B, a top view of cross section 102 of IC package 100 is shown in accordance with the embodiment introduced in FIG. 1. Cross section 102 is a ground plane for IC package 100.

From a vantage point above package 100, region 220 of cross section 102 is situated above region 210 of cross section 101, wherein region 220 comprises openings 221–228 that are situated respectively above openings 211–218 of region 210. Again, openings 221–228 are created for accommodating shielding vias 201–208 (numbered but not shown) running vertically within IC package 100. Because shielding vias 201–208 are in contact with the ground plane (i.e., cross section 102), they provide shortest possible path for ground return current. Unlike shielding vias 201–208 which go through cross section 102 and continue on to cross section 103, shield via 209 starts from cross section 101 and ends at cross section 102. As such, no opening in region 220 of cross section 102 need to be placed above opening 219 in region 210 of cross section 210.

On the other hand, openings 229a and 229b are respectively situated above openings 219a and 219b. Openings 229a and 229b are created for respectively accommodating differential signaling lines 289a and 289b. As shown, openings 229a and 229b in the ground plane are realized to avoid electrical contact between the ground plane and -differential signaling lines 289a and 289b, thereby isolating signal transmission from the ground plane (i.e., cross section 102).

Similar to region 210 of cross section 101 shown in FIG. 1, region 220 shown in FIG. 2 can be thought of as a portion of the continuous quasi-coaxial vertical cable structure running from the top signal layer of IC package 100 to the signal layer on PWB 150.

In region 220, castellations 262 and 272 at the package edge enhance isolation between a pair of differential signaling wires 289a and 289b and their adjacent pairs of differential signaling wires, and suppress radiation from the transition at high frequency. As such, castellations 262 and 272 are adapted to shield radiation emitted by differential lines 289a and 289b. Castellations 262 and 272 are coated with metal or another electrically conducting material and realize an electrical connection between the ground plane on layers 104, 103, and 102, and the ground ring layout in region 210 on layer 101. Those electrical connections can also be realized with solid vias cut in half during the package singulation process.

Figure 2C:
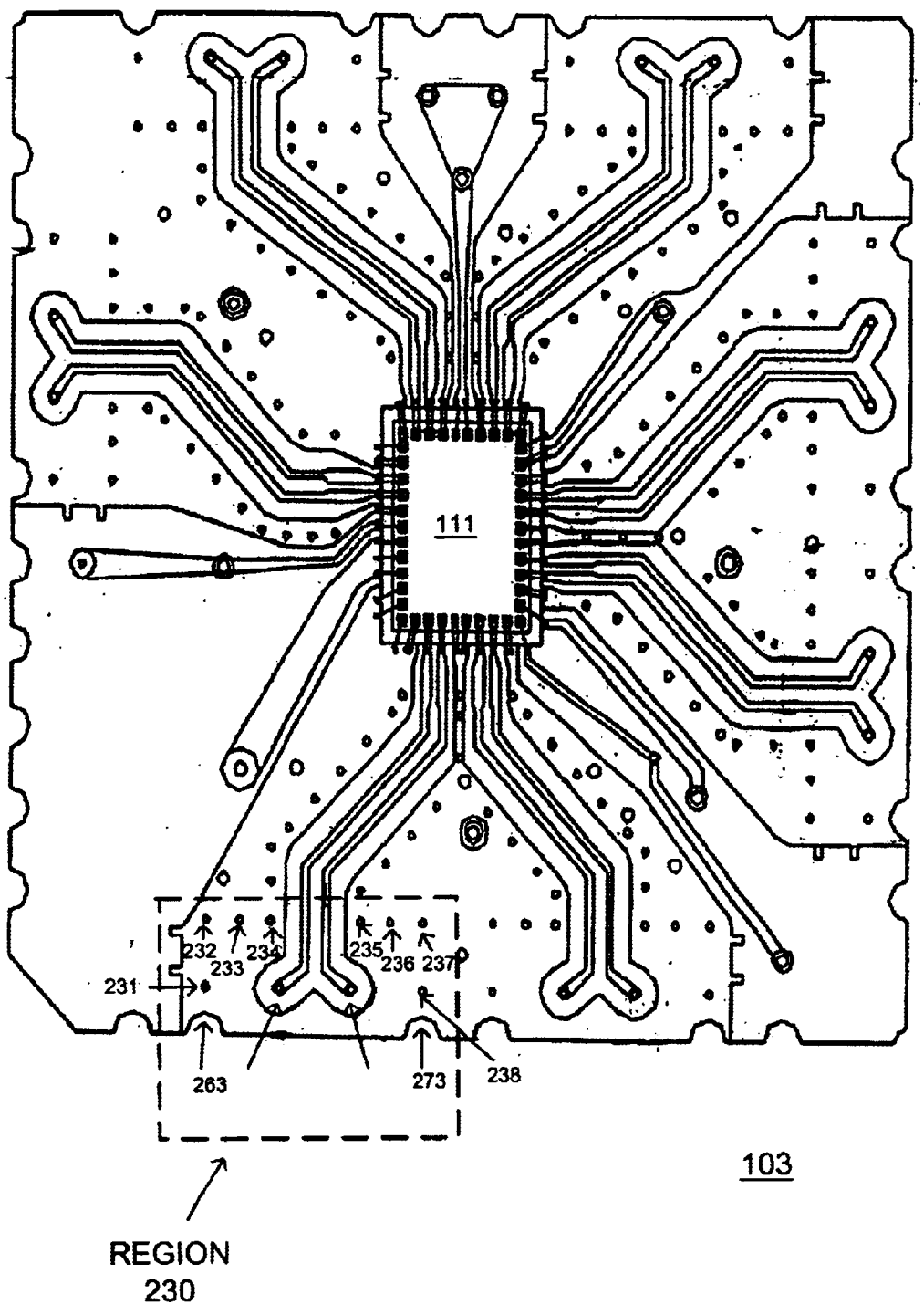
FIG. 2C depicts a cross-section of the IC package in accordance with the embodiment introduced in FIG. 1.

Referring now to FIG. 2C, top view of cross section 103 of IC package 100 is shown in accordance with the embodiment introduced in FIG. 1. As shown, I/Os of die 111 are connected to coupled transmission lines for differential signaling -at the level of cross section 103.

From a vantage point above package 100, region 230 of cross section 103 is situated above region 220 of cross section 101, wherein region 230 comprises openings 231–238 that are situated respectively above openings 221–228 of cross section 220. Again, openings 231–238 are created for accommodating shielding vias 201–208 (numbered but not shown) running vertically within IC package 100. Openings 239a and 239b are situated respectively above openings 229a and 229b. Similar to openings 229a and 229b, openings 239a and 239b are also created for respectively accommodating differential signaling lines 289a and 289b (numbered but not shown).

Figure 3:
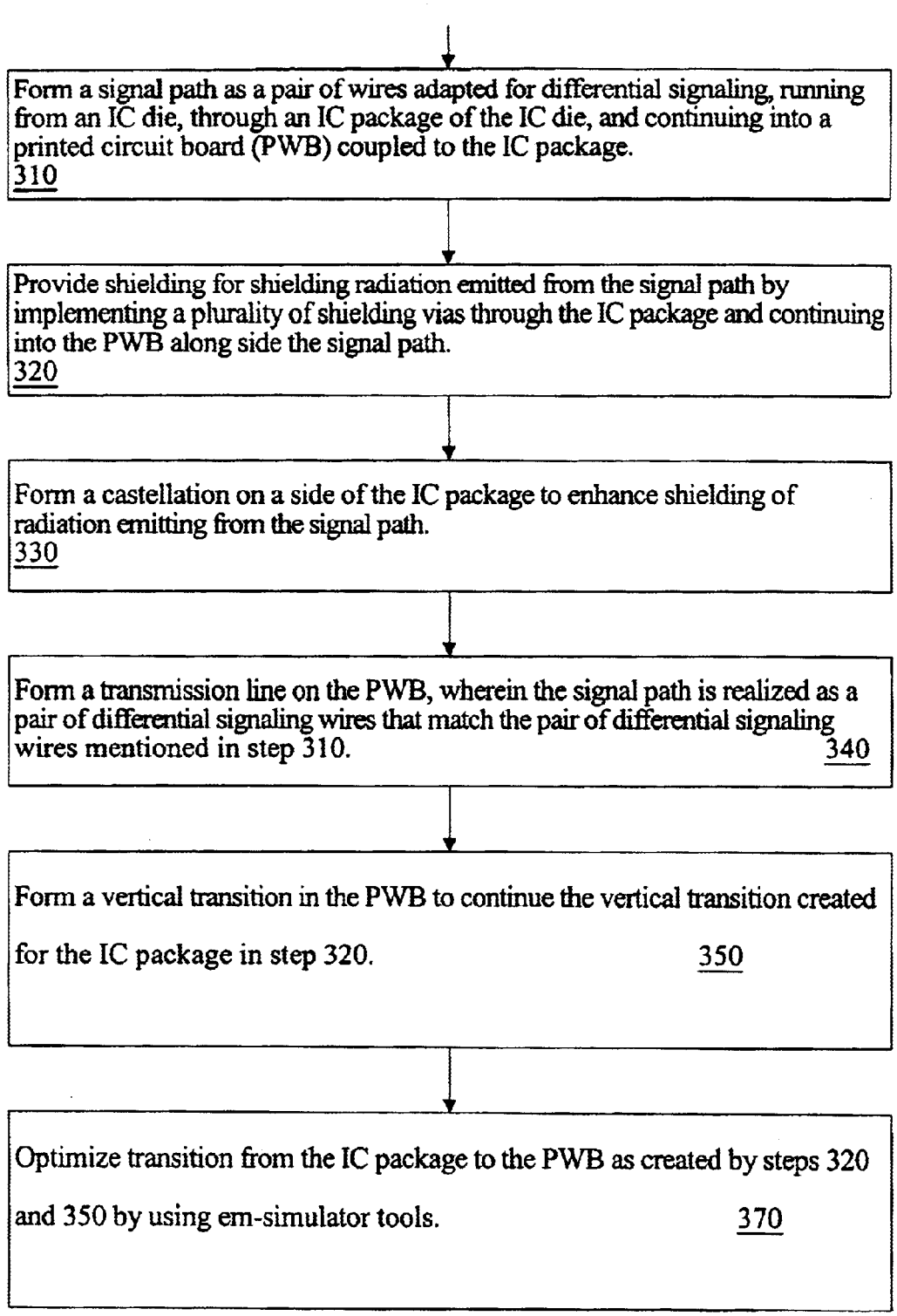
FIG. 3 is a flow chart outlining steps for IC packaging in accordance with one embodiment of the invention.

Similar to region 210 of cross section 101 shown in FIG. 1, region 230 shown in FIG. 3 can be thought of as a portion of the continuous quasi-coaxial vertical cable structure running from the top signal layer of IC package 100 to the signal layer on PWB 150.

In region 230, castellations 263 and 273 at the package edge enhance isolation between a pair of differential signaling wires 289a and 289b and their adjacent pairs of differential signaling wires, and suppress radiation from the transition at high frequency. As such, castellations 263 and 273 are adapted to shield radiation emitted by differential lines 289a and 289b. Castellations 263 and 273 are coated with metal or another electrically conducting material and realize an electrical connection between the ground plane on layers 104, 103, and 102, and the ground ring layout in region 210 on layer 101. Those electrical connections can also be realized with solid vias cut in half during the package singulation process.

Figure 2D:
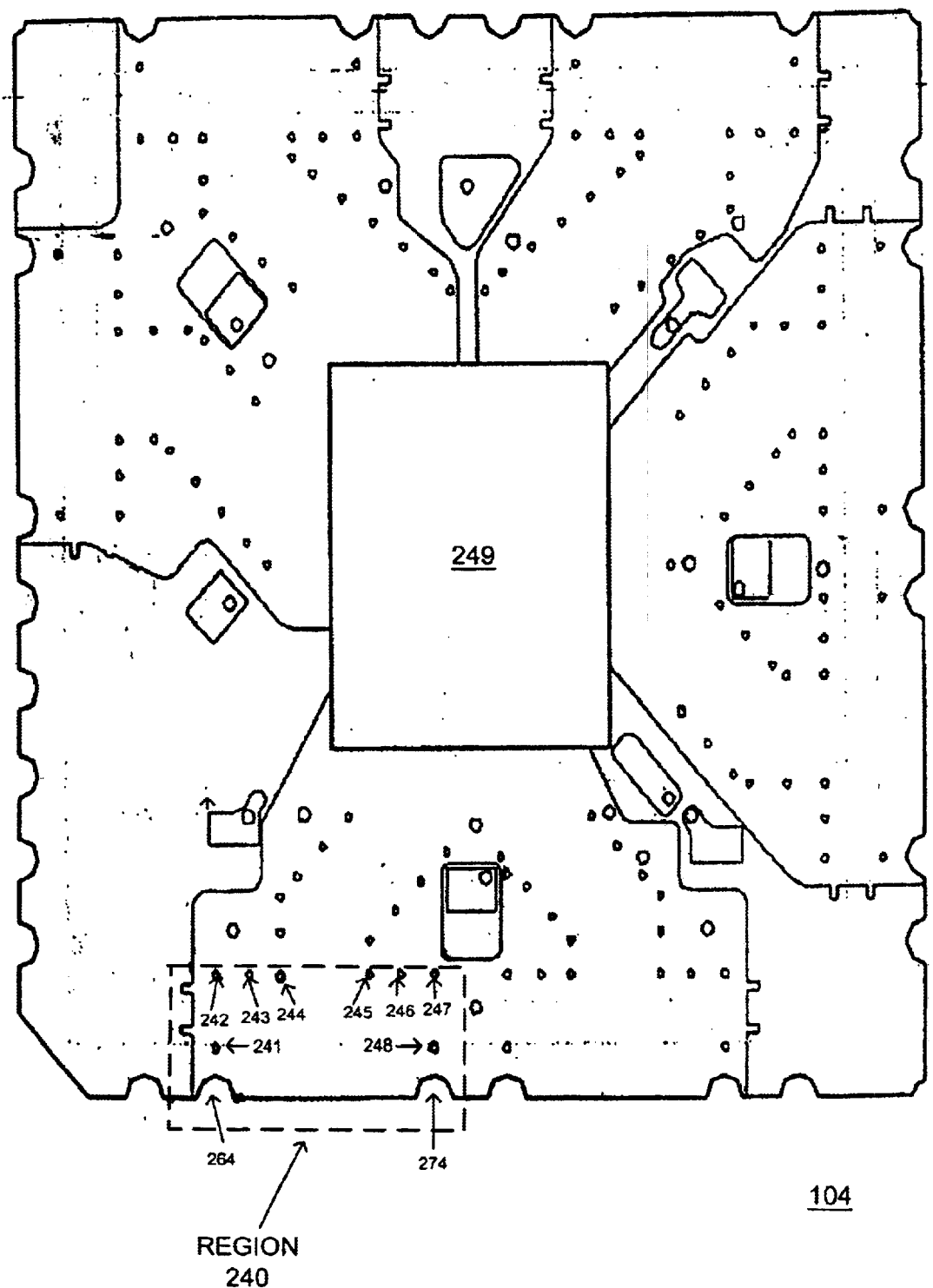
FIG. 2D depicts a cross-section of the IC package in accordance with the embodiment introduced in FIG. 1.

Referring now to FIG. 2D, top view of cross section 104 of IC package 100 is shown in accordance with the embodiment introduced in FIG. 1. An opening 249 in cross section 104 allows room for mounting die 111 onto IC package 100.

From a vantage point above package 100, region 240 of cross section 104 is situated above region 230 of cross section 103, wherein region 240 comprises openings 241–248 that are situated respectively above openings 231–238 of cross section 230. Again, openings 241–248 are created for accommodating shielding vias 201–208 (numbered but not shown) running vertically within IC package 100.

In region 240, castellations 264 and 274 at the package edge enhance isolation between a pair of differential signaling wires 289a and 289b and their adjacent pairs of differential signaling wires, and suppress radiation from the transition at high frequency. As such, castellations 264 and 274 are adapted to shield radiation emitted by differential lines 289a and 289b. Castellations 264 and 274 are coated with metal or another electrically conducting material and realize an electrical connection between the ground plane on layers 104, 103, and 102, and the ground ring layout in region 210 on layer 101. Those electrical connections can also be realized with solid vias cut in half during the package singulation process.

Figure 2E:
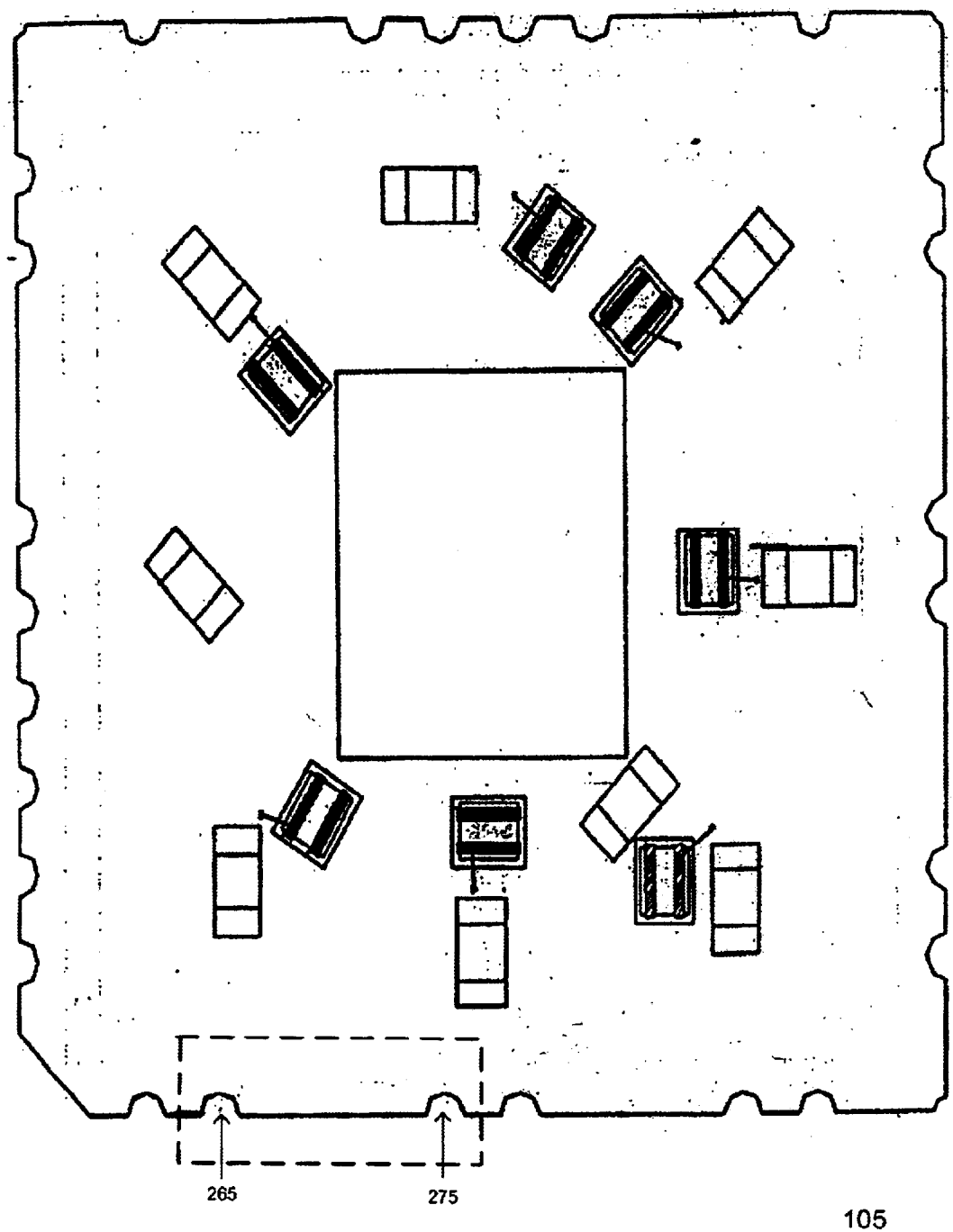
FIG. 2E depicts a cross-section of the IC package in accordance with the embodiment introduced in FIG. 1.

Referring now to FIG. 2E, top view of cross section 105 of IC package 100 is shown in accordance with the embodiment introduced in FIG. 1. Cross section 105 shows capacitor placement on top of layer 104 of IC package 100.

As understood herein, as shown in cross sections 101–105 of IC package 100, the use of castellation provides shielding of differential signaling wire lines 289a and 289b from their adjacent pairs of differential signaling wire lines. Also, as shown in cross section 101, self-alignment of package to board traces is facilitated by the use of ground ring layout, that also increases the reliability of second level joints. Moreover, the use of shielding vias 201–208 inside IC package 100 as well as in PWB 150 creates a matched shielded transition that avoids excitation of parasitic surface waves in PWB 150.

Specifically, the present embodiment eliminates the solder balls, thereby creating a vertical quasi-coaxial structure connecting the transmission lines (e.g., differential signaling wire lines 289a and 289b) inside IC package 100 to their matching transmission lines in PWB 150. The solder balls are eliminated and replaced with ad hoc layout on the bottom layer 101 of IC package 100 and with mating layout on the top layer of PWB 150.

Moreover, the design approach followed here considers the complete transition from IC package 100 to PWB 150, while the commonly used package design approaches do not. At high frequency however, designing a transmission line on the package only is not sufficient. The whole transition from IC package 100 to PWB 150 is designed to give particular attention not only to the impedance of the lines and the transition but also to the continuity of the current flow along both the signal path and the ground path.

Referring now to FIG. 3, a flow chart is shown outlining the steps performed for IC packaging design in accordance with one embodiment of the invention.

In step 310, a signal path is implemented as a pair of differential signaling wires running from an IC die, through an IC package of the IC, and continuing into a printed circuit board (PWB) coupled to the IC package. A transmission line (signal path) is thus created on the IC package. As a result, a continuous vertical path is created within the IC package for current flowing on signal and ground traces. The signal path is realized as a pair of coupled transmission lines for differential singaling with odd-mode impedance of 50 Ohm. However, the impedance need not be 50 Ohm, as long as the impedance is matched to the input and output impedance of the IC die contained in the IC package.

In step 320, shielding is provided for shielding radiation emitted from the signal path by implementing a plurality of shielding vias through the IC package and continuing into the PWB along side the signal path.

In step 330, a castellation is formed on a side of the IC package. The castellation is coated with electrically conducting material; the castellation is running approximately parallel to said plurality of shielding vias and providing further shielding of radiation emitted from the pair of differential signaling wires.

In step 340, a transmission line is created on the PWB. The signal path is realized as a pair of 50 Ohm odd mode impedance differential signaling wires that match the pair of 50 Ohm odd mode impedance differential signaling wires mentioned in step 310. As understood herein, the impedance need not be limited to 50 Ohm, as long as the impedance is matched to input and output impedance of the IC die.

In step 350, a vertical transition is created in the PWB to continue the vertical transition created for the IC package in step 320. The vertical transition has 50 Ohm impedance. However, as understood herein, the impedance need not be limited to 50 Ohm, as long as the impedance is matched to the input and output impedance of the IC die.

In step 370, transition from the IC package to the PWB as created by steps 320 and 350 is optimized using em-simulator tools.

As understood herein, above steps need not be implemented with 50 Ohm. In another embodiment, above steps can be implemented with a pair of differential signaling wires matched to the input and output impedance of the die within the IC package, wherein the pair of differential signaling wires might not have odd mode impedance equal to 50 Ohm.

Figure 4:
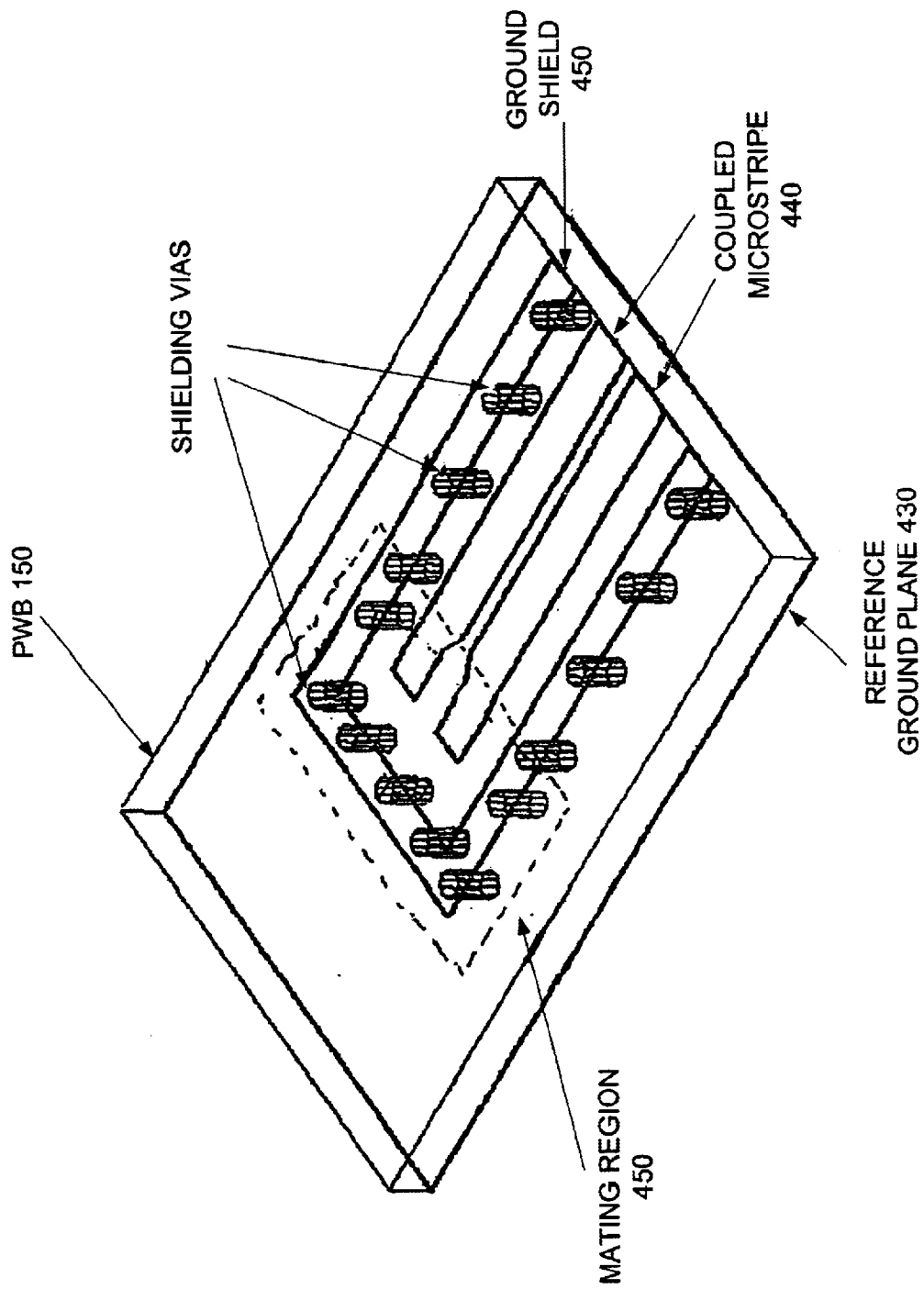
FIG. 4 depicts a three-dimensional view of a printed wiring board (PWB) adapted to be coupled to the IC package in accordance with the embodiment introduced in FIG. 1.

Referring now to FIG. 4 in view of FIG. 2A, a three-dimensional view is depicted for PWB 150 before it is coupled to an IC package 100 in accordance with the embodiment introduced in FIG. 1.

As shown, region 410 is adapted to mate to region 210 of IC package 100, where the number of shielding vias (401–407) in region 410 does not need to equal to the number of shielding vias (201–209) from IC package 100. Moreover, additional shielding vias 408–415 can be provided in PWB 150. Specifically, as long as shielding vias 401–415 as explicitly shown here provide shielding to the signal path (i.e., transmission lines) in PWB 150, shielding vias 401–415 need not be direct continuation of shielding vias 201–209 from IC package 100.

Moreover, PWB 150 comprises a reference ground plane 430, a coupled micro strip 440 for differential signaling and ground shield 450.

Again, the design approach followed here considers the complete transition from IC package 100 to PWB 150, while the commonly used package design approaches do not. At high frequency however, designing a transmission line on the package only is not sufficient. In contrast, the whole transition from IC package 100 to PWB 150 is designed to give particular attention not only to the impedance of the lines and the transition but also to the continuity of the current flow along both the signal path and the ground path.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. An integrated circuit (IC) package, comprising:
   a signal path having a pair of wires that are used for differential signaling, said signal path coupling an IC die to a printed wiring board (PWB) adapted to be coupled to the IC package, wherein said signal path is adapted to continue into the PWB; and
   a plurality of shielding vias surrounding said signal path and approximately parallel to said signal path lengthwise, said plurality of shielding vias adapted to shield radiation emitted from said signal path, wherein said plurality of shielding vias are adapted to continue into the PWB to provide shielding of radiation emitted from the continuation of said signal path within the PWB.

2. The IC package of claim 1, wherein the radiation can result from signal frequency beyond 10 GHz.

3. The IC package of claim 1, further comprising:
   a castellation formed on a side of said IC package, said castellation coated with electrically conducting material, said castellation running approximately parallel to said signal path and providing shielding of radiation emitted from said signal path, said castellations providing an electrical connection between the ground planes in the IC package and the ground ring layout on the PWB.

4. The IC package of claim 3, wherein the electrical connection is realized with solid vias cut in half during the package singulation process.

5. The IC package of claim 1, wherein said plurality of shielding vias are made of electrically conducting material.

6. The IC package of claim 1, wherein said signaling path is adapted to use odd-mode impedance of approximately 50 Ohm.

7. The IC package of claim 1, wherein said signaling path is adapted to use odd mode impedance that is matched to the input and output impedance of the IC die.

8. The IC package of claim 1, wherein the solder balls are eliminated and replaced with ad hoc layout on the bottom of the IC package, with mating layout on the top layer of the PWB.

9. A quasi-coaxial cable structure within an integrated circuit (IC) package, comprising:
   a plurality of shielding vias forming the outer shielding metal of the quasi-coaxial cable structure, said shielding vias approximately parallel to each other lengthwise; and
   a pair of coupled wires adapted for differential signaling, said pair of wires forming the center conducting member of the quasi-coaxial cable structure, said pair of wires surrounded by said plurality of shielding vias adapted to shield radiation emitted from said pair of wires, wherein said pair of wires are adapted to continue into a printed wiring board (PWB) adapted to be coupled to the IC package, and wherein said plurality of shielding vias are adapted to continue into the PWB to shield radiation emitting from said pair of wires within the PWB.

10. The quasi-coaxial cable structure of claim 9, wherein the radiation can result from signal frequency beyond 10 GHz.

11. The quasi-coaxial cable structure of claim 9, further comprising:
   a castellation formed on a side of the IC package, said castellation coated with electrically conducting material, said castellation running approximately parallel to said plurality of shielding vias and providing further shielding of radiation emitted from said pair of differential wires, said castellations providing an electrical connection between the ground planes in the IC package and the ground ring layout on the PWB.

12. The quasi-coaxial cable structure of claim 11, wherein said electrical connection is realized with solid vias cut in half during the package singulation process.

13. The quasi-coaxial cable structure of claim 9, wherein said plurality of shielding vias are made of electrically conducting material.

14. The quasi-coaxial cable structure of claim 9, wherein said pair of wires are adapted to use odd mode impedance of approximately 50 ohm.

15. The quasi-coaxial cable structure of claim 9, wherein said pair of wires are adapted to use odd mode impedance that is matched to the input and output impedance of a die with the IC package.

16. The quasi-coaxial cable structure of claim 9, wherein the solder balls are eliminated and replaced with ad hoc layout on the bottom of the IC package, with mating layout on the top layer of the PWB.

17. A method for IC packaging, said method comprising the steps of:
  creating a signal path as a pair of wires running from an IC die, through an IC package of the IC die, and continuing into a printed circuit board (PWB) coupled to the IC package, said pair of wires adapted for differential signaling; and
  providing shielding of radiation emitted from the signal path by running through the IC package and continuing into the PWB a plurality of shielding vias along side the signal path.

18. The method of claim 17, wherein the radiation can result from signal frequency beyond 10 GHz.

19. The method of claim 17, further comprising the step of:
  forming a castellation on a side of the IC package, the castellation coated with electrically conducting material, the castellation running approximately parallel to said plurality of shielding vias and providing further shielding of radiation emitted from the pair of wires, said castellations providing an electrical connection between the ground planes in the IC package and the ground ring layout on the PWB.

20. The method of claim 19, wherein said electrical connections is realized with solid vias cut in half during the package singulation process.

21. The method of claim 17, wherein the plurality of shielding vias are made of electrically conducting material.

22. The method of claim 17, wherein the pair of wires have odd mode impedance of approximately 50 obhm.

23. The method of claim 17, wherein the pair of wires are adapted to use odd mode impedance that is matched to the input and output impedance of a die with the IC package.

24. The method of claim 17, wherein the solder balls are eliminated and replaced with ad hoc layout on the bottom of the IC package, with mating layout on the top layer of the PWB.

25. An integrated circuit (IC) package system, comprising:
  within an IC package, a first signal path of a pair of wires adapted for differential signaling;
  within a printed wiring board (PWB) coupled to the IC package, a second signal path of a pair of wires adapted to continue said first signal path into the PWB;
  within the IC package, a first plurality of shielding vias positioned along side said first signal path, said first plurality of shielding vias adapted to shield radiation emitted by said first signal path; and
  within the PWB, a second plurality of shielding vias positioned along side said second signal path within the IC package, said second plurality of shielding vias adapted to continue said first plurality of shielding vias into the PWB, said second plurality of shielding vias adapted to shield radiation emitted by said second signal path.

26. The IC package system of claim 25, wherein the radiation can result from signal frequency beyond 10 GHz.

27. The IC package system of claim 25, further comprising:
  a castellation formed on a side of the IC package, said castellation coated with electrically conducting material, said castellation running approximately parallel to said first plurality of shielding vias and providing further shielding of radiation emitted from said first signal path, said castellations providing an electrical connection between the ground planes in IC package and the ground ring layout on the PWB.

28. The IC package system of claim 27, wherein said electrical connection is realized with solid vias cut in half during the package singulation process.

29. The IC package system of claim 25, wherein said first plurality of shielding vias are made of electrically conducting material, and wherein said second plurality of shielding vias are made of electrically conducting material.

30. The IC package system of claim 25, wherein said first signal path is adapted to use odd mode impedance of approximately 50 ohm, and wherein said second signal path is adapted to used odd mode impedance of approximately 50 ohm.

31. The IC package system of claim 25, wherein said first signal path is adapted to use odd mode impedance that is matched to the input and output impedance of an IC die contained with the IC package, and wherein said second signal path is adapted to used odd mode impedance that is matched to the input and output impedance of the IC die contained with the IC package.

32. The IC package system of claim 25, wherein the solder balls are eliminated and replaced with ad hoc layout on the bottom of the IC package, with mating layout on the top layer of the PWB.

* * * * *